United States Patent [19]
Zimmer

[11] Patent Number: 4,883,214
[45] Date of Patent: Nov. 28, 1989

[54] HEATED TOOL WITH HEATED SUPPORT

[75] Inventor: Gero Zimmer, Munich, Fed. Rep. of Germany

[73] Assignee: Productech Reflow Solder Equipment Inc., Rolling Hills Est., Calif.

[21] Appl. No.: 215,625

[22] Filed: Jul. 6, 1988

[30] Foreign Application Priority Data

Jul. 9, 1987 [DE] Fed. Rep. of Germany ....... 3722730

[51] Int. Cl.$^4$ ............................................... B23K 3/00
[52] U.S. Cl. .......................................... 228/9; 228/51; 228/180.2; 219/209; 219/233; 219/85.16; 219/85.18
[58] Field of Search ...................... 228/180.2, 228, 6.2, 228/44.7, 51, 9, 179, 227; 219/78.01, 78.13, 229, 233, 243, 209, 210, 85 D, 85 F

[56] References Cited

U.S. PATENT DOCUMENTS

| | | | |
|---|---|---|---|
| 2,551,244 | 5/1951 | Clark et al. | 219/85 D |
| 3,343,433 | 9/1967 | Rozmus | 219/233 |
| 3,617,682 | 11/1971 | Hall | 219/85 F |
| 4,255,644 | 3/1981 | Delorme | 228/179 |
| 4,426,571 | 1/1984 | Beck | 228/264 |
| 4,654,507 | 3/1987 | Hubbard et al. | 219/233 |

FOREIGN PATENT DOCUMENTS

| | | | |
|---|---|---|---|
| 2848519 | 5/1980 | Fed. Rep. of Germany | 219/233 |
| 1117167 | 10/1984 | U.S.S.R. | 228/51 |
| 2041808 | 9/1980 | United Kingdom | 219/233 |

OTHER PUBLICATIONS

IBM Technical Disclosure Bulletin, "Individually Controllable ... Tip", vol. 18, No. 12, p. 3984, May 1976.

Primary Examiner—Richard K. Seidel
Assistant Examiner—Samuel M. Heinrich
Attorney, Agent, or Firm—Notaro & Michalos

[57] ABSTRACT

A heating apparatus for heating components to be connected to each other which are supported on a thin substrate comprises a U-shaped heating tool which is brought down on the components and a U-shaped support which engages a lower surface of the substrate. Both the tool and the support are heated to reduce a temperature gradient or thermal losses through the substrate. The support also absorbs the forces of the tool when the tool is pressed against the parts to be connected to each other.

6 Claims, 3 Drawing Sheets

HEATED TOOL WITH HEATED SUPPORT

FIELD AND BACKGROUND OF THE INVENTION

The present invention relates in general to heated tools and, in particular, to a new and useful heated tool having a support for engaging the opposite side of parts to be connected together by heat, the support also being heated to reduce the heat gradient across the parts. The heating tools may either be moved to the objects to be treated, or connected, or mounted in a fixed position with the object to be treated, or connected being brought to the heated tool.

Thermal energy is either supplied to the objects to be treated, or connected by radiant heating from heated surfaces of the tool, or by direct thermal contact between the heated tool and the object. A controlled force is usually applied against the object by the heated tool. An additional thermal conductive material may be used to increase heat flow from the heated tool to the object. Flux, for example, may be provided, for increasing the transfer of heat and for reducing oxidation during the thermal process.

Such tools may supply heat either continuously or during selected time periods only. Heat may be applied during heating pulses, which may be activated or controlled by various external conditions, for example, by forcing the heated tool against the object to be heated or connected.

Various sources of heat are known for heating the heated tool to a variety of selected temperatures. Hot gases and/or electric current, for example, may be used for heating specified heat supplying areas or surfaces of the tool.

For the present invention, it is preferable to utilize the flow of electrical current through a heated tool for heating the tool. This permits controlled pulse-heating, featuring fast heating rates, as well as precise temperature control at various areas of the tool.

A known generally U-shaped heated tool is disclosed in German Pat. No. 2,848,519. This heated tool is mounted to holders, either using screws or by welding. This keeps the heat supplying areas of the tool in position and further is used to provide electrical connectors for feeding electrical heating current to the tool. Such tools can be manufactured using sheet metal designs (see German Pat. Nos. 3,144,048.7, 3,137,859.5 and 3,137,860.9 to the present inventor). These heated tools can also be machined from solid materials.

The use of heated tools for heating and connecting thin parts having high thermal conductivity poses special problems. To accommodate the force applied by the heated tools, the thin parts must be mechanically supported. The presence of a mechanical support, however, produces a large thermal load on the heated tool and produces a large temperature gradient across the thin part.

SUMMARY OF THE INVENTION

An object of the present invention is to provide an apparatus for handling and thermally treating thin parts, particularly thin parts which have high thermal conductivity, while avoiding the high temperature gradients across the thin parts.

According to the present invention, the heated tool is used in conjunction with a heated support that can be heated either before, during or shortly after, the application of heat through the heated tool. This reduces the temperature gradient across the thin parts that are to be treated by the heated tool.

Advantageously, the invention utilizes a pulse heated support which limits heat transfer to the parts to a well defined area and time. The thermal energy supplied through the support can be identical to, smaller than, or larger than, the pulse energy supplied through the heated tool. This depends on the materials and geometry of the parts to be thermally treated.

The continuous or pulsed temperature at the support may be identical to the tool temperature. This reduces or entirely eliminates thermal flow across the parts. It might also be useful to set the temperature of the support lower than or higher than the heated tool to compensate for different thermal properties of the parts or substrates to be thermally treated.

Timing of the heating operation can also vary. For example, the support may be heated up prior to the application of heat and forced through the heated tool. The support can also be heated beyond the termination of heating through the tool or the heating of the support may end before heating through the tool ends.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENT

Figure 1:
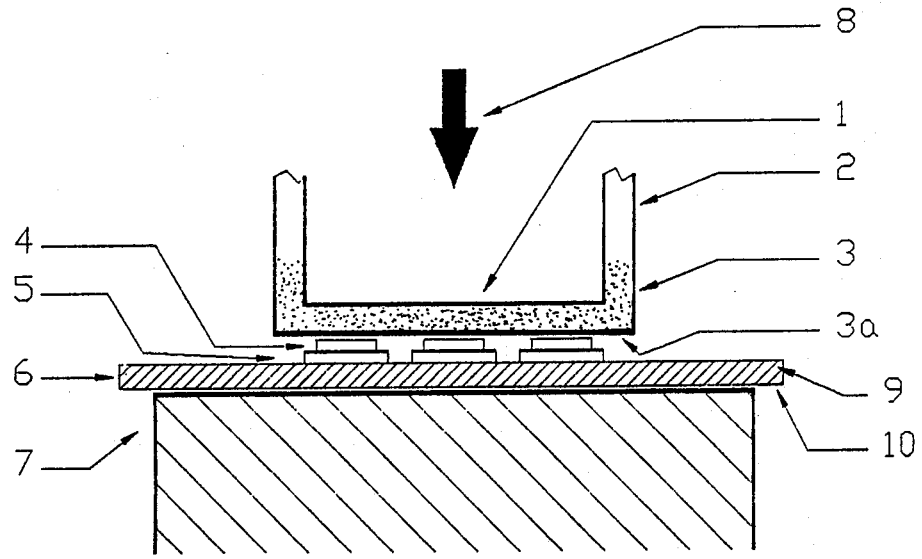
FIG. 1 is a schematic side elevational view of a heated tool and support which may be used in accordance with the present invention.

Referring to the drawings in particular, the invention embodied in FIG. 1 comprises a basic heated tool 1 having a holder 2 for holding the tool, for applying force to the tool in the direction of arrow 8, and for supplying electrical current to the tool. The heated tool 1 has a heating surface 3a and heating areas 3, which are heated by the passage of current as symbolized by the shading in these areas. In accordance with the invention, parts 4, which are typically leads of electrical components, are to be soldered or otherwise thermally connected to pads 5, disposed on a thin circuit board or substrate 6.

To absorb the force 8 and thermal stresses applied to the substrate 6, a heated support 7 is provided on a side of the substrate, opposite from the heated tool 1.

The thermal energy transferred from the heated areas 3a to the usually highly thermally conductive parts 4 and 5, in order to melt the solder coated onto these parts, is generally at 250° C. If the support 7 were not heated, it would be at about 25° C. This creates a temperature gradient of 225° C. across the substrates 6. If the substrate is thin and is made of material having low thermal conductivity, which is generally the case, substrate 6 experiences a temperature of 250° C. on its top surface 9 and 25° C. on its bottom surface 10. Such a high gradient within the material may easily damage the substrate.

A different problem exists if substrate 6 has higher thermal conductivity, as in the case of aluminum oxide. To compensate such conductivity, a much higher temperature must be supplied to the tool surface 3a, or, in accordance with the invention, the support 7 must be heated to reduce or eliminate the temperature gradient.

Figure 2:
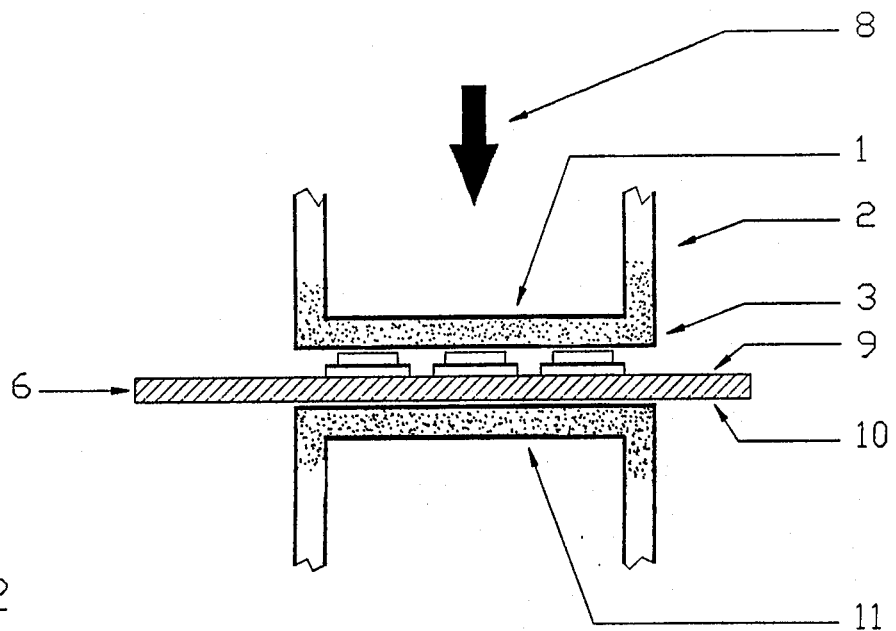
FIG. 2 is a view similar to FIG. 1 of a preferred embodiment of the invention.

FIG. 2 shows a preferred form of the invention, wherein the heated tool 1 on one side of the structures to be heat treated is complemented by a substrate fixture or support 11, on the opposite side of the structures to be heat treated. The fixture 11 is advantageously of the same dimensions and shape as the tool 1 and has identical thermal and mechanical properties.

According to the invention, the temperature for support 11 is pulse controlled and is turned on only when the force 8 applied to the tool 1 has reached a preset level. The temperature to which the support 11 is brought can be set to be higher or lower than that of the tool 1. This can be used to compensate for different specific items 4, 5 and 6 to be treated. If substrate 6 is particularly sensitive to temperature gradients, the difference in temperature between tool 1 and support 11 may be very small or within a certain tolerance level.

Figure 3:
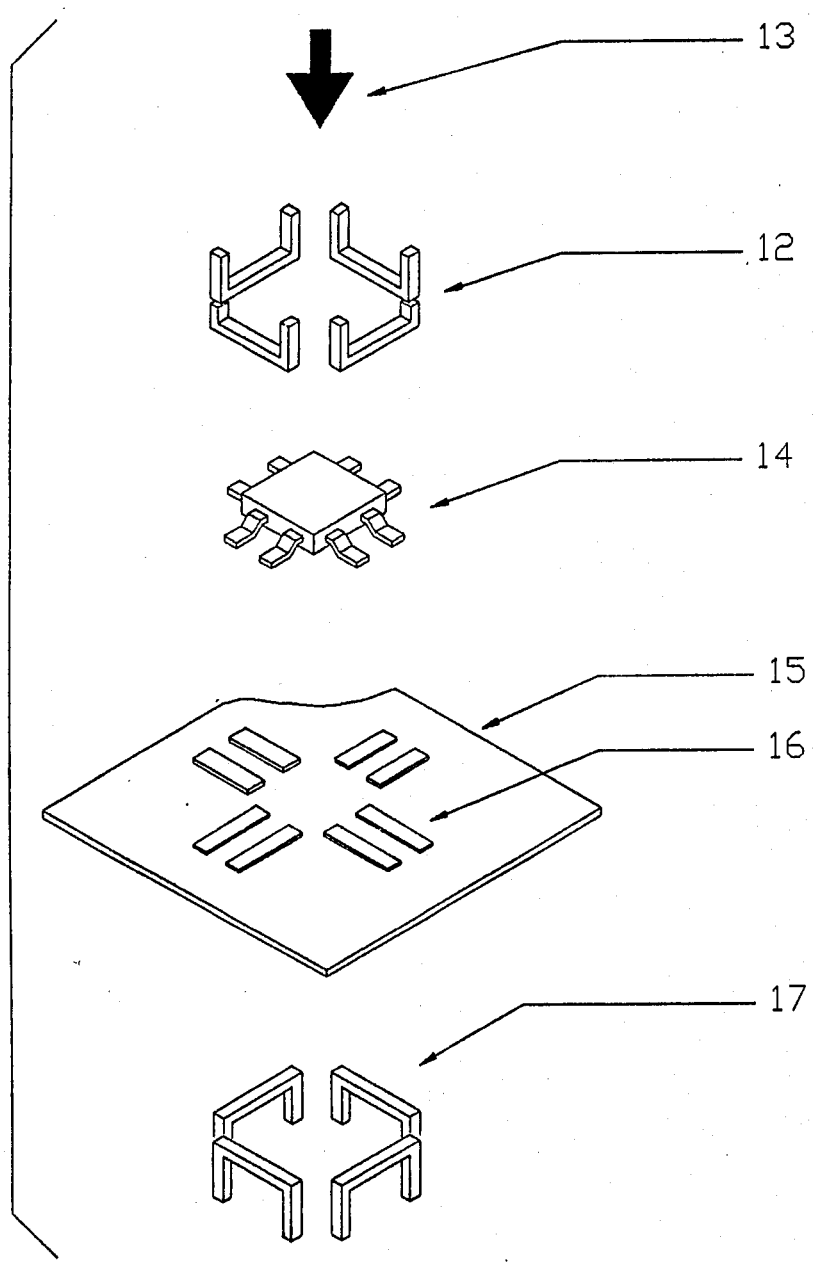
FIG. 3 is an exploded, perspective view of the embodiment of FIG. 2 used for connecting four sets of leads to pads on a circuit board.

FIG. 3 illustrates a practical application of the invention, wherein four substantially identical pulse heated tools are mounted together as a single solid mechanical unit 12. Force 13 can be applied to the tools of unit 12 against leads 14 of an electronic component to connect them to pads 16 on a substrate or circuit board 15. Substrate 15 may be extremely thin and made of insulating material without fear of thermal damage. Support unit 17, provided below substrate 15, may also be pulse heated and is substantially identical to unit 12 in mechanical and thermal properties.

In accordance with the invention, the time required to make this solder connection between parts 14 and 16 is extremely low, since an extremely low thermal mass needs to be heated up. The temperatures applied to the substrate, as well as to the parts to be connected together, can be limited to a precise level, depending on the size and shape of the heating and support bars.

Figure 4:
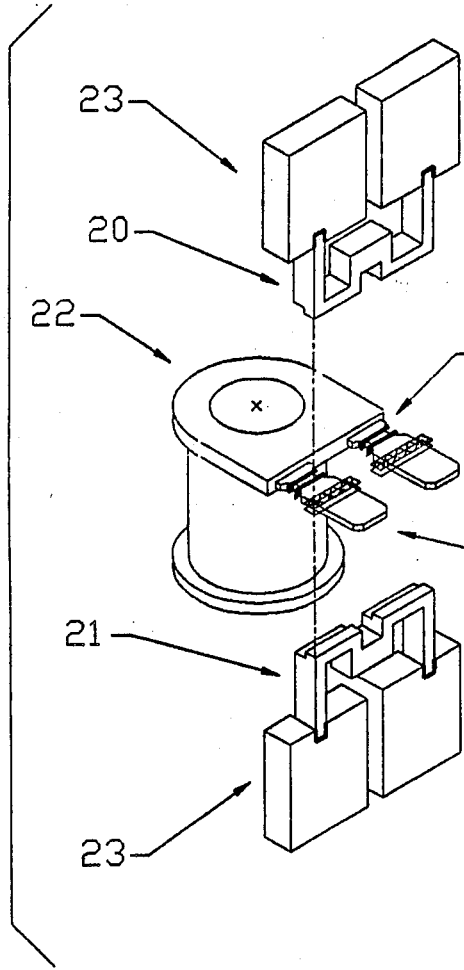
FIG. 4 is an exploded perspective view of a further embodiment of the invention for connecting wires to a pair of leads.
Figure 4A:
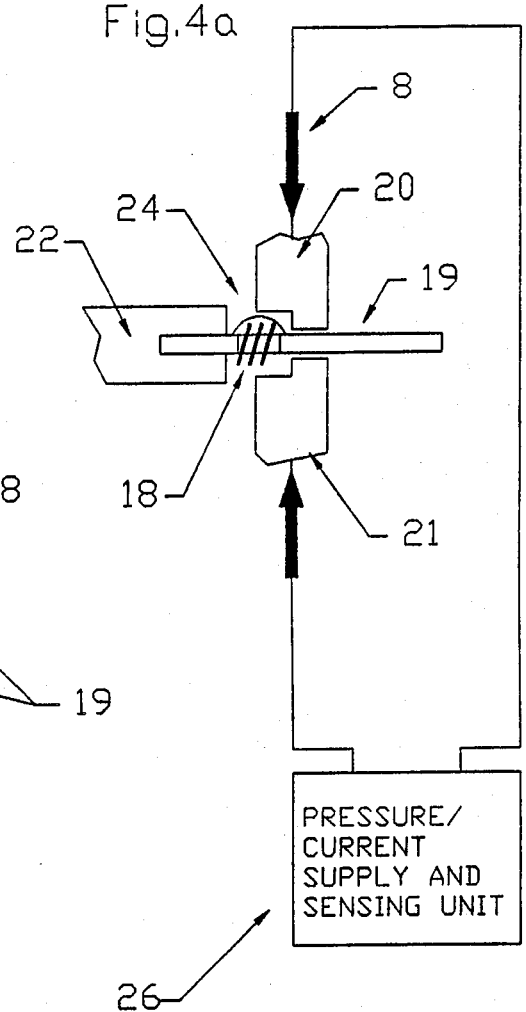
FIG. 4A is a fragmentary side sectional view of the embodiment of FIG. 4.

FIG. 4 illustrates a typical application for thermally connecting high conductivity materials. In this application, wires 18 are to be soldered to terminals 19, using a continuous or pulse heated tool 20. This application requires a similarly shaped and powered support tool 21, in order to compensate for thermal heat flow in the terminals 19. Wires 18 may be the wires of a bobbin 22 which include a coil for a magnetic device, for example. Supports 23 are provided for applying pressure to the tool 20 and support 21. Solder 24 is provided around the wires 18, which can be melted by the tool 20 for connecting the wires to the terminals 19.

FIG. 4 also shows pressure/current supply in sensing unit 26 which is connected to the tool 20 and the support 21 for supplying forces to the tool 20 and current to both of the tools to heat them up. Unit 26 may incorporate sensors for determining the temperature of the tool and support and for controlling the temperature, as well as for controlling the time that heating is applied to the tool and/or support.

While a specific embodiment of the invention has been showed and described in detail to illustrate the application of the principles of the invention, it will be understood that the invention may be embodied otherwise without departing from such principles.

What is claimed is:

1. An apparatus for heating parts to be thermally treated, the parts being supported on a thin substrate, the apparatus comprising a heating tool for heating and applying pressure to the top of the parts which are supported on a thin substrate, and a heated mechanical support under the substrate aligned with the tool for absorbing forces exerted by the tool and for heating the bottom of the substrate to compensate for a temperature gradient produced across the thickness of the substrate by heating of the tool, whereby a low temperature gradient is produced across the thickness of the substrate, said tool and support each comprising a U-shaped structure having a heating portion and a pair of support portions connected to opposite ends of the heating portion.

2. An apparatus according to claim 1, wherein each of said tool and support comprises a plurality of U-shaped structures.

3. An apparatus according to claim 1, including means for supplying approximately identical currents to said tool and said support for approximately similar periods of time.

4. An apparatus according to claim 1, including power and temperature sensing and controlling means connected to both of said tool and said support for controlling the temperature of said tool and said support.

5. An apparatus according to claim 1, wherein the support is heated to a higher extent that the tool to compensate for substrate having high thermal conductivity.

6. An apparatus according to claim 1, wherein the tool is heated to a greater temperature than the support.

* * * * *